United States Patent
Okumura et al.

(10) Patent No.: US 7,423,315 B2
(45) Date of Patent: Sep. 9, 2008

(54) SEMICONDUCTOR DEVICE AND METHOD FOR MANUFACTURING THE SAME

(75) Inventors: Hideki Okumura, Ibo-gun (JP); Hitoshi Kobayashi, Yokohama (JP); Masanobu Tsuchitani, Kawasaki (JP); Satoshi Aida, Himeji (JP); Shigeo Kouzuki, Himeji (JP); Masaru Izumisawa, Kawasaki (JP); Satoshi Taji, Himeji (JP); Kenichi Tokano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 11/265,208

(22) Filed: Nov. 3, 2005

(65) Prior Publication Data

US 2006/0108600 A1 May 25, 2006

(30) Foreign Application Priority Data

Nov. 5, 2004 (JP) ............................. 2004-322494

(51) Int. Cl.
    H01L 29/36 (2006.01)
(52) U.S. Cl. ................................. 257/328; 257/E29.258
(58) Field of Classification Search .................. 257/20, 257/328, E29.258
    See application file for complete search history.

(56) References Cited

U.S. PATENT DOCUMENTS 6,081,009 A * 6/2000 Neilson ...................... 257/341
6,410,958 B1 6/2002 Usui et al.
7,052,982 B2 * 5/2006 Hshieh et al. ............... 438/525
2004/0238844 A1 12/2004 Tokano et al.
2005/0006699 A1 * 1/2005 Sato et al. ................... 257/327
2005/0181577 A1 * 8/2005 Hshieh ........................ 438/427

FOREIGN PATENT DOCUMENTS

| JP | 8-222735 | 8/1996 |
| JP | 2002-170955 | 6/2002 |

* cited by examiner

Primary Examiner—Bradley W. Baumeister
Assistant Examiner—Amar Movva
(74) Attorney, Agent, or Firm—Oblon, Spivak, McClelland, Maier & Neustadt, P.C.

(57) ABSTRACT

The present application provides a semiconductor device including a first-conductivity type semiconductor substrate, a pillar structure portion formed on the first-conductivity type semiconductor substrate and formed of five semiconductor pillar layers arranged in one direction parallel to a main surface of the first-conductivity type semiconductor substrate, and isolation insulating portions formed on the first-conductivity type semiconductor substrate and sandwiching the pillar structure portion between the isolation insulating portions, wherein the pillar structure portion is formed of a first first-conductivity type pillar layer, a second first-conductivity type pillar layer and a third first-conductivity type pillar layer which sandwich the first first-conductivity type pillar layer, a first second-conductivity type pillar layer provided between the first first-conductivity type pillar layer and the second first-conductivity type pillar layer, and a second second-conductivity type pillar layer provided between the first first-conductivity type pillar layer and the third first-conductivity type pillar layer.

20 Claims, 10 Drawing Sheets

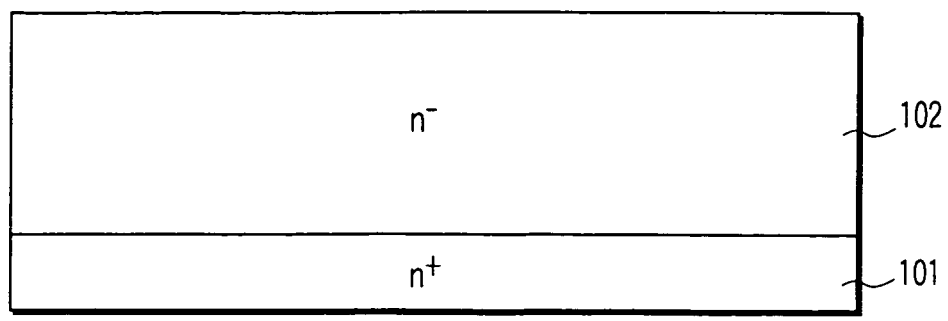
F I G. 13
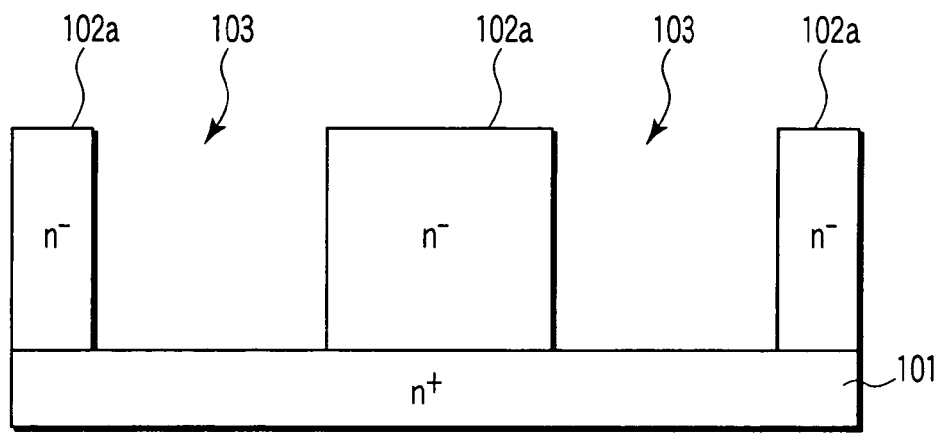
F I G. 14
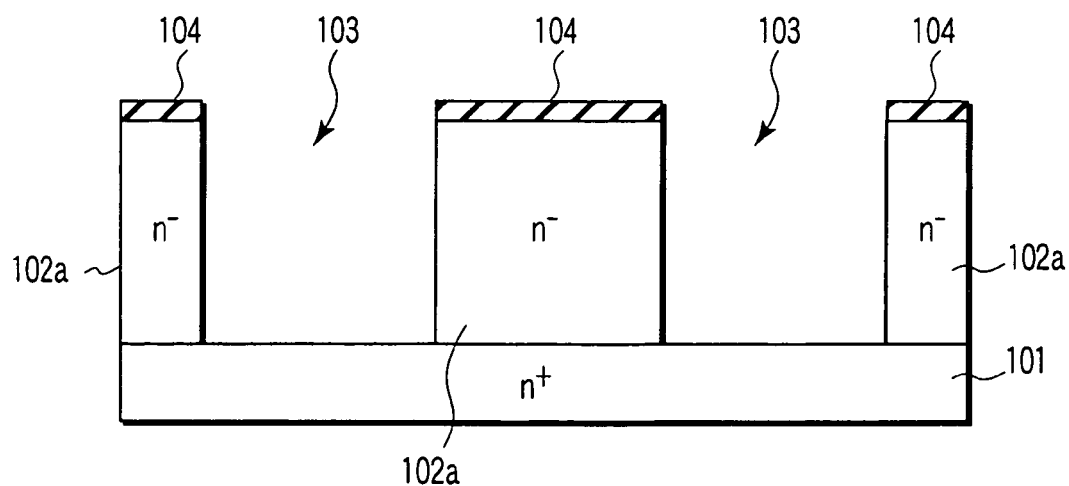
F I G. 15

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2004-322494, filed Nov. 5, 2004, the entire contents of which are incorporated herein by reference.

BACKGROUND OF THE INVENTION

1. Field of the Invention

The present invention relates to a semiconductor device and a method for manufacturing the semiconductor device.

2. Description of the Related Art

In recent years, a super junction structure has been proposed which is a power MOSFET achieving a reduced loss (Jpn. Pat. Appln. KOKAI Publication No. 2002-170955).

FIG. 12 is a sectional view showing an example of a conventional super junction MOSFET (SJ-MOSFET) that uses a trench structure. In FIG. 12, reference numeral 61 denotes an n-type drain layer (n-type semiconductor substrate) of a high impurity concentration. Reference numeral 62 is an insulating film buried in a trench. Reference numerals 63, 64, and 65 denote a p-type pillar layer, an n-type pillar layer, and a p-type base layer. Reference numerals 66, 67, and 68 denote an n-type source layer, a gate insulating film, and a gate electrode.

To completely deplete a drift region in SJ-MOSFET, it is necessary to control the dose in the pillar layers to at most about $1\times10^{12}$ cm$^{-2}$. The dose in the pillar layers is determined by the product of the net concentration of impurities in the pillar layers and the width of the pillar layers. To reduce the resistance of the pillar layers, it is necessary to reduce the width of the pillar layers (reduce pillar pitch), while increasing the concentration of impurities.

In the conventional trench type super junction structure, a reduction in pillar pitch increases the ratio of the area of trenches to the area of an element region in which the pillar layers are formed. Further, ions are obliquely implanted in sides of the trenches. This precludes the width of the trenches from being reduced. Therefore, in the conventional structure, the resistance cannot be efficiently reduced simply by reducing the pillar pitch.

Thus, in the conventional SJ-MOSFET, it is difficult to reduce the pillar pitch (to reduce the width of the pillar layers). Accordingly, the concentration of impurities in the pillar layers cannot be increased. This makes it difficult to reduce the resistance of the pillar layers (to reduce on resistance). Furthermore, in the conventional SJ-MOSFET, it is difficult to efficiently form pillar layers.

BRIEF SUMMARY OF THE INVENTION

A first aspect of the present invention, there is provided a semiconductor device, comprising: a first-conductivity type semiconductor substrate; a pillar structure portion formed on the first-conductivity type semiconductor substrate and formed of five semiconductor pillar layers arranged in one direction parallel to a main surface of the first-conductivity type semiconductor substrate; and isolation insulating portions formed on the first-conductivity type semiconductor substrate and sandwiching the pillar structure portion between the isolation insulating portions, wherein the pillar structure portion is formed of a first first-conductivity type pillar layer, a second first-conductivity type pillar layer and a third first-conductivity type pillar layer which sandwich the first first-conductivity type pillar layer, a first second-conductivity type pillar layer provided between the first first-conductivity type pillar layer and the second first-conductivity type pillar layer, and a second second-conductivity type pillar layer provided between the first first-conductivity type pillar layer and the third first-conductivity type pillar layer.

A second aspect of the present invention, there is provided a semiconductor device, comprising: a first-conductivity type semiconductor substrate; and a pillar structure portion formed on the first-conductivity type semiconductor substrate and formed of a first first-conductivity type pillar layer, a second first-conductivity type pillar layer and a third first-conductivity type pillar layer which sandwich the first first-conductivity type pillar layer, a first second-conductivity type pillar layer provided between the first first-conductivity type pillar layer and the second first-conductivity type pillar layer, and a second second-conductivity type pillar layer provided between the first first-conductivity type pillar layer and the third first-conductivity type pillar layer, which are arranged in one direction parallel to a main surface of the first-conductivity type semiconductor substrate, wherein the second first-conductivity type pillar layer has a first-conductivity type impurity concentration higher than that of the first first-conductivity type pillar layer and that of the first second-conductivity type pillar layer, and the third first-conductivity type pillar layer has a first-conductivity type impurity concentration higher than that of the first first-conductivity type pillar layer and that of the second second-conductivity type pillar layer, the second first-conductivity type pillar layer has a second-conductivity type impurity concentration higher than that of the first first-conductivity type pillar layer and that of the first second-conductivity type pillar layer, and the third first-conductivity type pillar layer has a second-conductivity type impurity concentration higher than that of the first first-conductivity type pillar layer and that of the second second-conductivity type pillar layer, and each of the first second-conductivity type pillar layer and the second second-conductivity type pillar layer has a second-conductivity type impurity concentration higher than that of the first first-conductivity type pillar layer.

A third aspect of the present invention, there is provided a method for manufacturing a semiconductor device, the method comprising: forming a first-conductivity type semiconductor portion on a first-conductivity type semiconductor substrate, the first-conductivity type semiconductor portion containing first-conductivity type impurities, being sandwiched between first and second trenches and being defined by a first side surface of each of the first and second trenches; forming first impurity layers by supplying predetermined first-conductivity type impurities and predetermined second-conductivity type impurities having a diffusion coefficient larger than that of the predetermined first-conductivity type impurities, to the first side surface of each of the first and second trenches; diffusing the predetermined first- and second-conductivity type impurities supplied to the first impurity layers into the first-conductivity type semiconductor portion to obtain a pillar structure portion which is formed of a first first-conductivity type pillar layer having a first-conductivity type based on first-conductivity type impurities contained in the first-conductivity type semiconductor portion, a second first-conductivity type pillar layer and a third first-conductivity type pillar layer sandwiching the first first-conductivity type pillar layer and having a first-conductivity type based on the predetermined first-conductivity type impurities supplied to the first impurity layers, and a first second-conductivity type pillar layer and a second second-conductivity type pillar layer provided between the first first-conductivity type pillar layer and the second first-conductivity type pillar layer and between the first first-conductivity type pillar layer and the third first-conductivity type pillar layer, respectively, and having a second-conductivity type based on the predetermined second-conductivity type impurities supplied to the first impurity layers.

A fourth aspect of the present invention, there is provided a method for manufacturing a semiconductor device, the method comprising: forming a semiconductor portion on a first-conductivity type semiconductor substrate, the semiconductor portion being sandwiched between first and second trenches and being defined by a first side surface of each of the first and second trenches; forming first impurity layers by supplying predetermined first-conductivity type impurities and predetermined second-conductivity type impurities having a diffusion coefficient larger than that of the predetermined first-conductivity type impurities, to the first side surface of each of the first and second trenches; forming first and second additional semiconductor portions in the first and second trenches, respectively; and diffusing the predetermined first- and second-conductivity type impurities supplied to the first impurity layers into the semiconductor portion and the first and second additional semiconductor portions to obtain a pillar structure portion which is at least formed of two first-conductivity type pillar layers having a first-conductivity type based on the predetermined first-conductivity type impurities supplied to the first impurity layers, and a second-conductivity type pillar layer provided between these two first-conductivity type pillar layers and having a second-conductivity type based on the predetermined second-conductivity type impurities supplied to the first impurity layers.

BRIEF DESCRIPTION OF THE SEVERAL VIEWS OF THE DRAWING

FIGS. 13 to 20 are sectional views schematically showing a process of manufacturing a semiconductor device in accordance with a fourth embodiment of the present invention;

DETAILED DESCRIPTION OF THE INVENTION

Embodiments of the present invention will be described below with reference to the drawings.

First Embodiment

Figure 1:
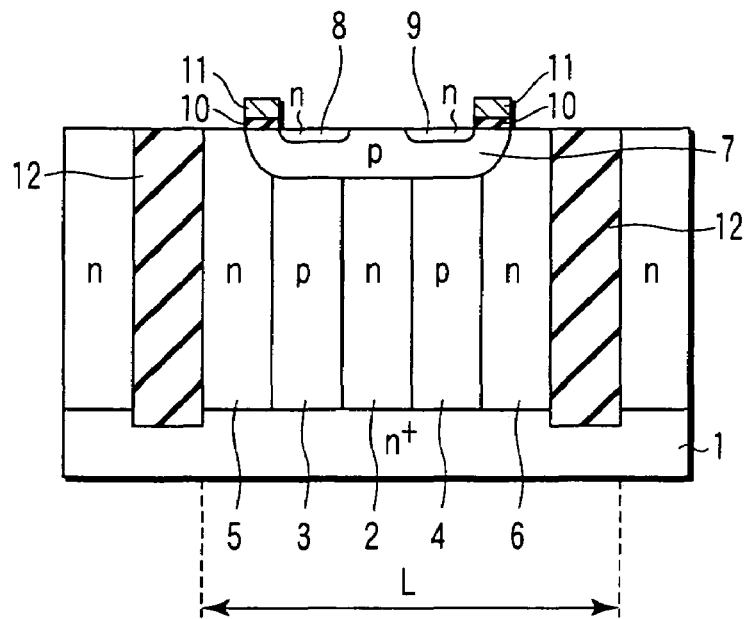
FIG. 1 is a sectional view schematically showing the configuration of a semiconductor device in accordance with a first embodiment of the present invention.

FIG. 1 is a sectional view schematically showing the configuration of a super junction MOSFET (SJ-MOSFET) in accordance with a first embodiment of the present invention.

In FIG. 1, reference numeral 1 denotes an n-type drain layer (n-type semiconductor substrate). A first n-type pillar layer 2 is provided on the n-type drain layer 1. First and second p-type pillar layers 3 and 4 are provided on the opposite sides of the first n-type pillar layer 2.

The first n-type pillar layer 2 and the first p-type pillar layer 3 form a pn junction having a junction interface almost perpendicular to a front surface of the n-type drain layer 1. Similarly, the first n-type pillar layer 2 and the second p-type pillar layer 4 form a pn junction having a junction interface almost perpendicular to the front surface of the n-type drain layer 1.

A second n-type pillar layer 5 is provided on an outer side surface of the first p-type pillar layer 3. The first p-type pillar layer 3 and the second n-type pillar layer 5 form a pn junction having a junction interface almost perpendicular to the front surface of the n-type drain layer 1. Similarly, a third n-type pillar layer 6 is provided on an outer side surface of the second p-type pillar layer 4. The second p-type pillar layer 4 and the third n-type pillar layer 6 form a pn junction having a junction interface almost perpendicular to the front surface of the n-type drain layer 1.

In this manner, SJ-MOSFET in accordance with the present embodiment has a pillar structure portion provided on the n-type drain layer (n-type semiconductor substrate) 1 and formed of the five semiconductor pillar layers 2, 3, 4, 5, and 6 arranged along one direction parallel to a main surface of the n-type drain layer 1. Further, in SJ-MOSFET in accordance with the present embodiment, these five semiconductor pillar layers 2, 3, 4, 5, and 6 form the four pn junctions.

A p-type base layer 7 is selectively formed on front surfaces of the n- and p-type pillar layers 2, 3, 4, 5, and 6 so as to expose parts of the surfaces of the second and third n-type pillar layers 5 and 6. N-type source layers 8 and 9 are selectively formed on a surface of the p-type base layer 7. Moreover, a gate insulating film 10 is provided on the p-type base layer 7 between the n-type source layer 8 and the second n-type pillar layer 5 and on the p-type base layer 7 between the n-type source layer 9 and the third n-type pillar layer 6. A gate electrode 11 is provided on the gate insulating film 10.

Source electrodes (not shown) are provided on the n-type source layers 8 and 9. The source electrodes are in contact with the p-type base layer 7. A drain electrode (not shown) is provided on a back surface of the n-type drain layer 1.

Isolation insulating films (isolation insulating portions) 12 formed in trenches are provided outside the second n-type pillar layer 5 and third n-type pillar layer 6. Accordingly, in SJ-MOSFET in accordance with the present embodiment, the pillar structure portion sandwiched between the isolation insulating films 12 has the four pn junctions formed by the n- and p-type pillar layers 2, 3, 4, 5, and 6. On the other hand, the conventional SJ-MOSFET shown in FIG. 12 comprises only two pn junctions. Further, SJ-MOSFET in accordance with the present embodiment has the same unit cell length (cell pitch) L as that of the conventional SJ-MOSFET. The unit cell length is for example, 20 μm.

Figure 2:
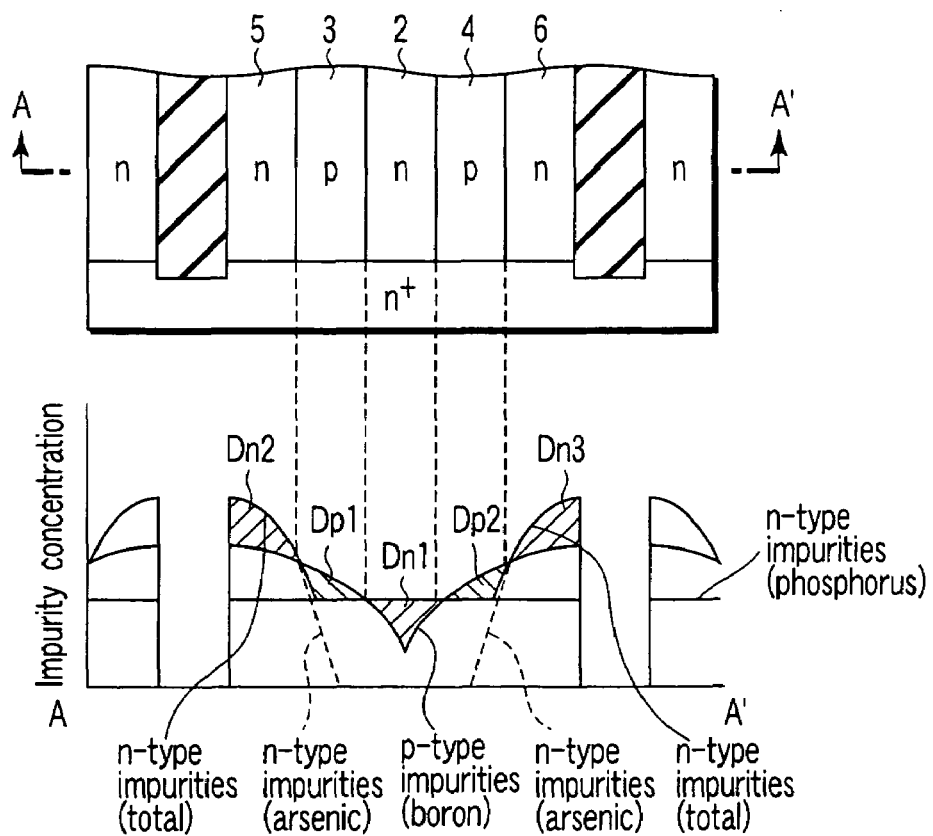
FIG. 2 is a diagram schematically showing an example of a concentration profile of impurities in accordance with the first embodiment of the present invention.

FIG. 2 is a diagram schematically showing an example of a concentration profile of n- and p-type impurities in SJ-MOSFET in accordance with the present embodiment.

The impurity concentration profile shown in FIG. 2 is obtained by diffusing predetermined n-type impurities (in the present embodiment, arsenic (As)) and predetermined p-type impurities (in the present embodiment, boron (B)) to an n-type epitaxial layer (in the present embodiment, the n-type epitaxial layer is doped with phosphorus (P)) from impurity layers formed on side surfaces of trenches as described later. Accordingly, a diffusion profile of the predetermined n-type impurities (arsenic) is reflected in the concentration profile of the n-type impurities. A diffusion profile of the predetermined p-type impurities (boron) is reflected in the concentration profile of the p-type impurities. This results in such a concentration profile of n-type impurities (total concentration profile of phosphorus (P) and arsenic (As)) and a concentration profile of p-type impurities (concentration profile of boron (B)) as shown in FIG. 2. The axis of ordinate (impurity concentration) is shown on a logarithmic scale. Accordingly, for a region with a high impurity concentration, the concentration profile (broken line) of arsenic (As) almost coincides with the total concentration profile of the n-type impurities.

As shown in FIG. 2, for the first n-type pillar layer 2, the second n-type pillar layer 5, and the third n-type pillar layer 6, the n-type impurity concentration (total concentration of phosphorus and arsenic) is higher than the p-type impurity concentration (boron concentration). For the first p-type pillar layer 3 and second p-type pillar layer 4, the p-type impurity concentration is higher than the n-type impurity concentration.

The n-type impurity concentration decreases gradually from an end to the center of the pillar structure portion. Accordingly, the n-type impurity concentration of the second n-type pillar layer 5 is higher than that of the first p-type pillar layer 3. Likewise, the n-type impurity concentration of the third n-type pillar layer 6 is higher than that of the second p-type pillar layer 4. Further, the p-type impurity concentration decreases gradually from the end to the center of the pillar structure portion. Accordingly, the p-type impurity concentration of the second n-type pillar layer 5 is higher than that of the first p-type pillar layer 3. Likewise, the p-type impurity concentration of the third n-type pillar layer 6 is higher than that of the second p-type pillar layer 4. Further, the p-type impurity concentration of the first p-type pillar layer 3 is higher than that of the first n-type pillar layer 2. Likewise, the p-type impurity concentration of the second p-type pillar layer 4 is higher than that of the first n-type pillar layer 2.

The above concentration profiles are obtained because the predetermined p-type impurities (boron) have a larger diffusion coefficient than the predetermined n-type impurities (arsenic). The above concentration profiles can be obtained by utilizing the difference in diffusion coefficient (diffusion speed) to adjust diffusion conditions (diffusion temperature, diffusion time, and the like).

The p-type impurities with the same concentration as that of the n-type impurities are present at the boundary between the first p-type pillar layer 3 and the first n-type pillar layer 2 and at the boundary between the second p-type pillar layer 4 and the first n-type pillar layer 2. Thus, the p-type impurities (boron) are necessarily present in the first n-type pillar layer 2. Consequently, the predetermined p-type impurities (boron) are present in the first n-type pillar layer 2, first p-type pillar layer 3, second p-type pillar layer 4, second n-type pillar layer 5, and third n-type pillar layer 6. However, the p-type impurities (boron) need not be preset in all the regions of the first n-type pillar layer 2. The p-type impurities (boron) need not be present in a central portion of the first n-type pillar layer 2. Furthermore, the n-type impurities (phosphorus) originally contained in the n-type epitaxial layer are present in the first n-type pillar layer 2. Accordingly, the predetermined n-type impurities (arsenic) have only to be present in at least the first p-type pillar layer 3, second p-type pillar layer 4, second n-type pillar layer 5, and third n-type pillar layer 6.

Now, description will be given of the net concentration of impurities in the pillar layers 2, 3, 4, 5, and 6. The term "net impurity concentration" refers to the difference (absolute difference) between the n-type impurity concentration and the p-type impurity concentration. In FIG. 2, Dn1 denotes the net concentration of the n-type impurities in the first n-type pillar layer 2. Dn2 denotes the net concentration of the n-type impurities in the second n-type pillar layer 5. Dn3 denotes the net concentration of the n-type impurities in the third n-type pillar layer 6. Dp1 denotes the net concentration of the p-type impurities in the first p-type pillar layer 3. Dp2 denotes the net concentration of the p-type impurities in the second p-type pillar layer 4.

Figure 11:
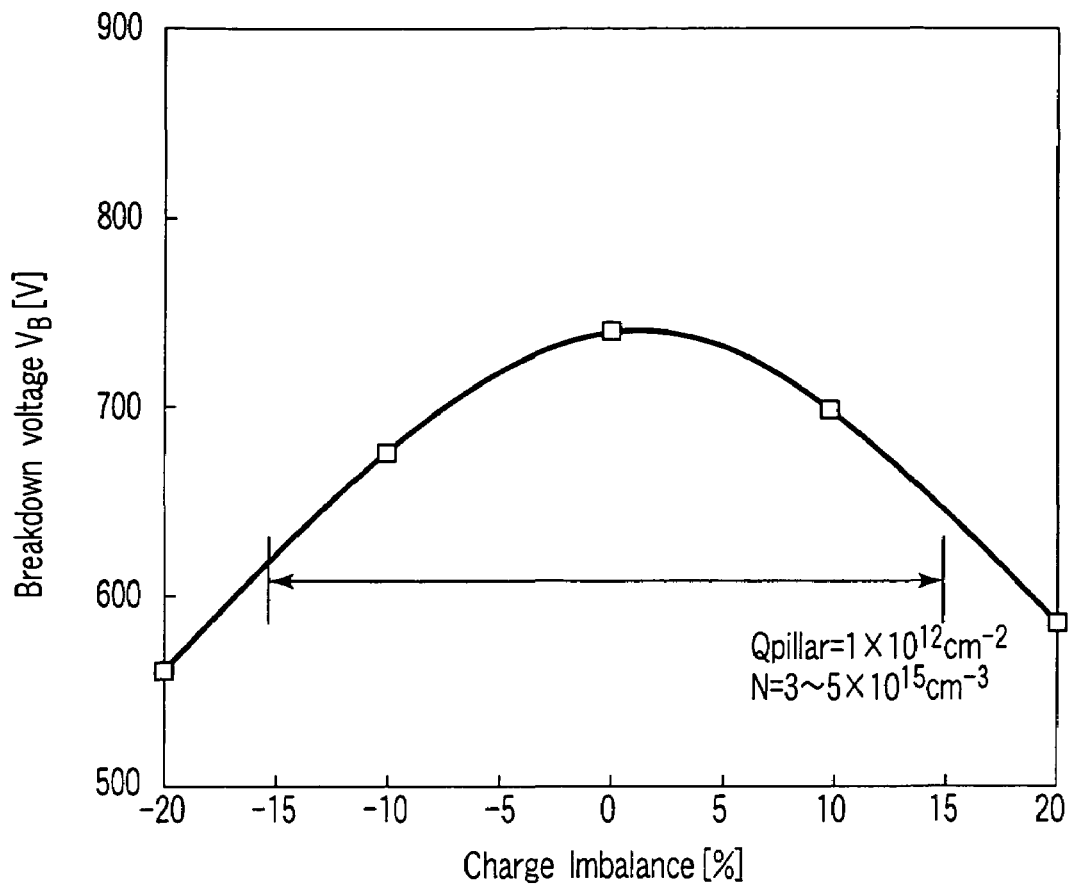
FIG. 11 is a diagram showing the relationship between a breakdown voltage and charge imbalance in SJ-MOSFET in accordance with the first embodiment of the present invention.

The present inventors' studies clearly show that a sufficient breakdown voltage (drain breakdown voltage $V_{DDS} \geq 600$ V) may be reliably obtained by setting the charge imbalance in the first n-type pillar layer 2, second n-type pillar layer 5, third n-type pillar layer 6, first p-type pillar layer 3, and second p-type pillar layer 4 to within the range of ±15% as shown in FIG. 11.

Let M1 be the total net amount of n-type impurities in the first n-type pillar layer 2, second n-type pillar layer 5, and third n-type pillar layer 6. Let M2 be the total net amount of p-type impurities in the first p-type pillar layer 3 and second p-type pillar layer 4. Then, M1 and M2 have only to meet the following formula.

$$-15 \leq 100(M2-M1)/M1 \leq 15$$

In FIG. 11, $V_{DDS} \geq 600$ V when the charge imbalance is within the range of ±17%. However, in view of a variation in process or the like, to ensure that $V_{DDS} \geq 600$ V, it is appropriate to set the charge imbalance to within the range of ±15%.

A value (the dose of impurities) obtained by integrating the amounts of impurities in the five pillar layers 2 to 6 in a direction perpendicular to side surfaces of trenches is $1\times10^{12}$ cm$^{-2}$. This value ($1\times10^{12}$ cm$^{-2}$) is divided by the dimension of the five pillar layers 2 to 6 across the pitch to obtain an impurity concentration (volume density of impurities) of about 3 to $5\times10^{15}$ cm$^{-3}$. Further, the unit cell length (pitch) L is about 20 μm. The dimension of the five pillar layers 2 to 6 is about 15 μm. The impurity concentration is not limited to 3 to $5\times10^{15}$ cm$^{-3}$ but may be 3 to $10\times10^{15}$ cm$^{-3}$. Further, the dimension of the five pillar layers 2 to 6 may be about 10 to 12 μm.

Setting the charge imbalance as described above causes a depletion layer to completely deplete the n-type pillar layers 2, 5, and 6 and the p-type pillar layers 3 and 4 before breakdown occurs; the depletion layer extends in a lateral direction from the junction between the n-type pillar layer and the p-type pillar layer. This results in a sufficient breakdown voltage.

As described above, in the present embodiment, the five pillar layers (n-type pillar layers 2, 5, and 6 and p-type pillar layers 3 and 4) are formed in the pillar structure portion sandwiched between the isolation insulating films 12. Only three pillar layers are conventionally formed in the pillar structure portion. Accordingly, with the same unit cell length L, the present embodiment can reduce the width of each pillar layer (the n-type pillar layer 2, 5, and 6 and the p-type pillar layers 3 and 4) compared to the prior art. This enables the pillar layer to be completely depleted even with an increase in the concentration of impurities in the pillar layer. Consequently, the present embodiment enables on resistance (the resistance of the pillar layer) to be reduced without reducing the breakdown voltage.

FIGS. 3 to 7 are sectional views schematically showing a method for manufacturing SJ-MOSFET in accordance with the present embodiment.

Figure 3:
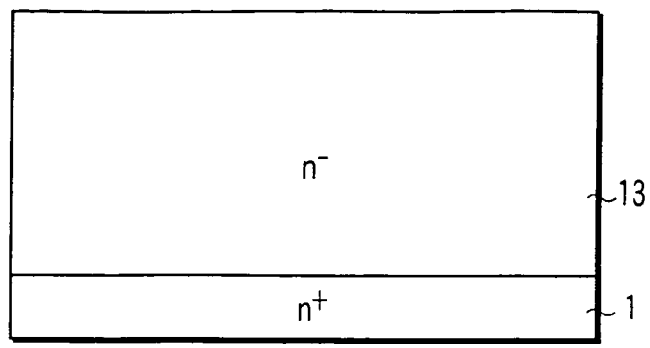
FIGS. 3 to 7 are sectional views schematically showing a process of manufacturing a semiconductor device in accordance with the first embodiment of the present invention.

First, as shown in FIG. 3, an n-type epitaxial layer 13 with a low impurity concentration (high resistance) is formed on an n-type drain layer (n-type semiconductor substrate) 1 with a high impurity concentration. The n-type epitaxial layer 13 contains phosphorus (P) as n-type impurities.

Figure 4:
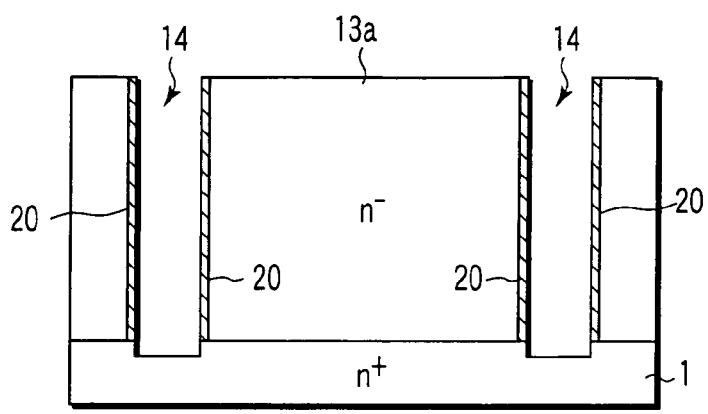

Then, as shown in FIG. 4, photolithography and RIE (Reactive Ion Etching) are used to form trenches 14 in the n-type epitaxial layer 13; the trenches 14 reach the n-type drain layer. On this occasion, overetching is carried out so that the trenches 14 reliably reach the n-type drain layer 1. As a result, a bottom surface of each trench 14 is lower than a top surface of the n-type drain layer 1. Thus, an n-type semiconductor portion 13a is formed which is sandwiched between the trenches (first and second trenches) 14 and which is defined by a side surface (first side surface) of each trench 14.

Then, a parallel ion implantation process is used to implant arsenic (As: predetermined n-type impurities) and boron (B: predetermined p-type impurities) into side walls of the trenches. As a result, impurity layers 20 containing As and B are formed on the side surfaces of the trenches 14.

Figure 5:
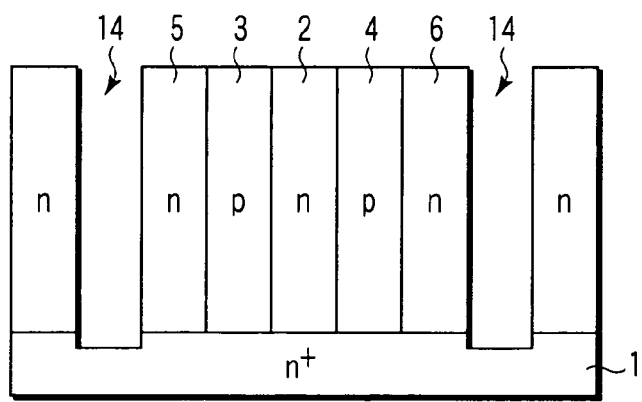

Then, as shown in FIG. 5, a thermal treatment is carried out to simultaneously diffuse As and B supplied to the impurity layers 20, into the n-type epitaxial layer 13. As a result, As and B are diffused into the n-type semiconductor portion 13a, from the impurity layers (first impurity layers) 20 formed on the opposite side surfaces (corresponding to the side surfaces of the trenches 14) of the n-type semiconductor portion 13a. This forms a pillar structure portion formed of the n- and p-type pillar layers 2 to 6. B has a larger diffusion coefficient than As. Accordingly, the n- and p-type pillar layers 2 to 6 with such impurity profiles as shown in FIG. 2 can be formed by appropriately setting parallel ion implantation process conditions and thermal treatment conditions. The n- and p-type pillar layers 2 to 6 have an impurity concentration of 3 to $10\times10^{15}$/cm$^3$; their impurity concentration can be set higher than that in the prior art by at least one figure.

Figure 6:
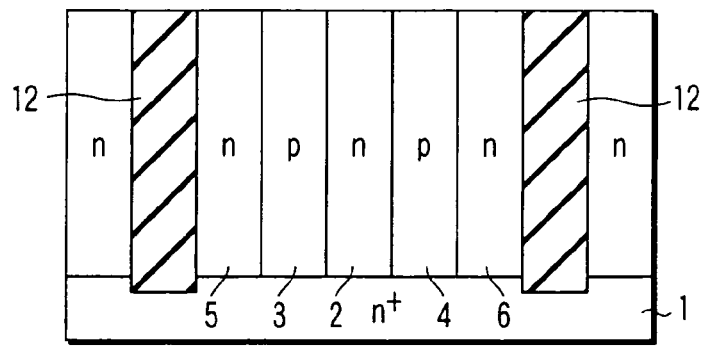

Then, an insulating film is formed all over the surface so as to fill the trenches 14. Subsequently, a CMP (Chemical Mechanical Polishing) process is used to flatten the surface, while the insulating film outside the trenches 14 is removed. This forms isolation insulating portions 12 in the trenches 14 as shown in FIG. 6.

Figure 7:
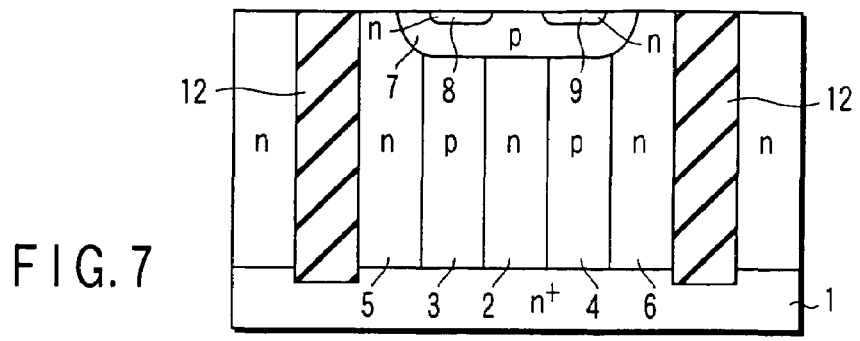

Then, as shown in FIG. 7, a p-type base layer 7 is formed on the surfaces of the n- and p-type pillar layers 2 to 6. Moreover, an n-type source layers 8 and 9 are formed on a surface of the p-type base layer 7.

The succeeding steps are similar to those of a well-known process of manufacturing SJ-MOSFET. That is, the following steps are executed: a step of forming a gate insulating film 10 and a gate electrode 11 (see FIG. 1), a step of forming an interlayer insulating film, a step of forming contact holes in the interlayer insulating film, and a step of forming a source electrode and a drain electrode.

Figure 12:
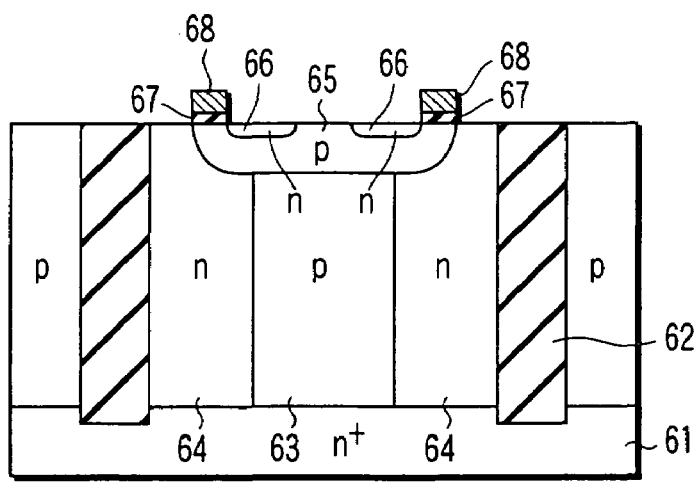
FIG. 12 is a sectional view schematically showing the configuration of a semiconductor device in accordance with the prior art.

As described above, the number of steps in the process of manufacturing SJ-MOSFET in accordance with the present embodiment is substantially the same as that in the conventional process of manufacturing SJ-MOSFET as shown in FIG. 12. By appropriately setting conditions for the process of forming the n- and p-type pillar layers 2 to 6 shown in FIG. 5, it is possible to form five pillar layers 2 to 6 with such an impurity profile as shown in FIG. 2, in the one pillar structure portion sandwiched between the trenches 14 (isolation insulating portions 12). Consequently, the present embodiment enables the formation of pillar layers narrower than those in accordance with the prior art without the need to increase the number of manufacturing steps. This makes it possible to increase the concentration of impurities in each pillar layer, thus enabling the formation of SJ-MOSFET with a reduced on resistance.

In the present embodiment, after the n- and p-type pillar layers 2 to 6 shown in FIG. 5 are formed, isolation insulating portions 12 are formed in the step shown in FIG. 6. However, isolation insulating portions 12 may be formed after the impurity layer 20 has been formed in the step shown in FIG. 4 and before n- and p-type pillar layers 2 to 6 are formed.

Second Embodiment

Figure 8:
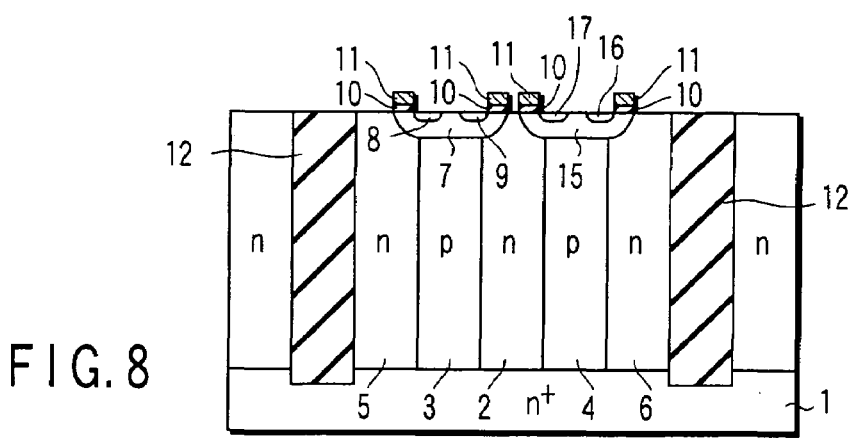
FIG. 8 is a sectional view schematically showing the configuration of a semiconductor device in accordance with a second embodiment of the present invention.

FIG. 8 is a sectional view schematically showing the configuration of SJ-MOSFET in accordance with a second embodiment of the present invention. The basic configuration and manufacturing method in accordance with the second embodiment are similar to those of the first embodiment. The same reference numerals as those in the first embodiment denote those components of the second embodiment which have the corresponding components of the first embodiment, with their detailed description omitted.

The present embodiment differs from the first embodiment in that the first n-type pillar layer 2 comprises a structure constituting a path for an electron current. A specific description will be given below.

A region in which the p-type base layer is not formed is provided in a central portion of the surface of the first n-type pillar layer 2. P-type base layers 7 and 15 are selectively formed in the unit cell. The p-type base layer 15 is formed across the surfaces of the first n-type pillar layer 2, second p-type pillar layer 4, and third n-type pillar layer 6 50 that the first n-type pillar layer 2 and third n-type pillar layer 6 are partly exposed. N-type source layers 16 and 17 are selectively formed on the surface of the p-type base layer 15. The gate insulating film 10 and the gate electrode 11 are provided on the p-type base layer 15 between the n-type source layer 16 and the third n-type pillar layer 6 and on the p-type base layer 15 between the n-type source layer 17 and the first n-type pillar layer 2.

The present embodiment exerts effects similar to those of the first embodiment. The present embodiment further forms four channels in the unit cell when the transistor is turned on. Consequently, the present embodiment is effective in increasing the degree of integration (improving shrinkage). That is, it is possible to provide SJ-MOSFET having both reduced on resistance and increased degree of integration (improved shrinkage).

Third Embodiment

Figure 9:
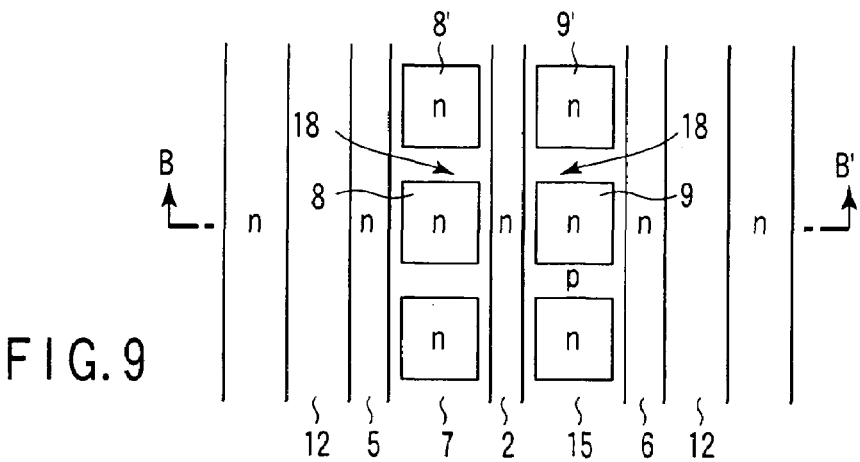
FIG. 9 is a plan view schematically showing the configuration of a semiconductor device in accordance with a third embodiment of the present invention.
Figure 10:
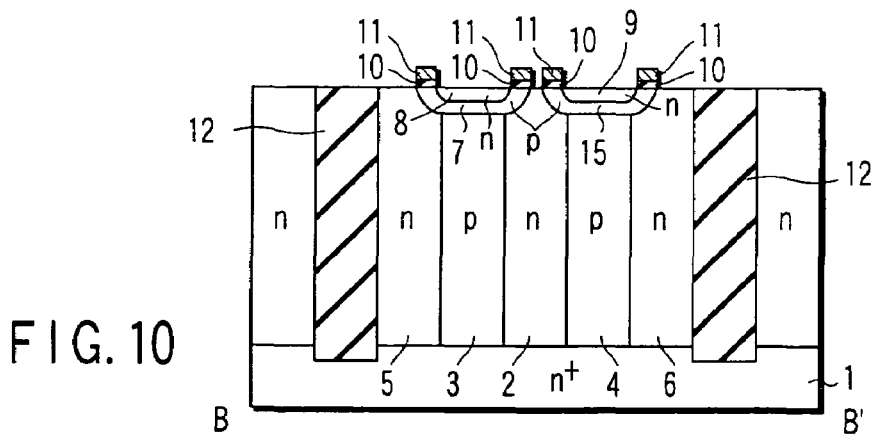
FIG. 10 is a sectional view schematically showing the configuration of the semiconductor device in accordance with the third embodiment of the present invention.

FIG. 9 is a plan view schematically showing the configuration of SJ-MOSFET in accordance with a third embodiment of the present invention. FIG. 10 is a sectional view taken along line B-B' in FIG. 9.

The present embodiment differs from the second embodiment in that n-type source layers 8, 9, 8', and 9' are formed in a direction perpendicular to the direction in which the n- and p-type pillar layers 2 to 6 are arranged. A specific description will be given below.

N-type source layers 8, 8', . . . are selectively formed on the surface of the p-type base layer 7 in a direction perpendicular to the direction in which the n- and p-type pillar layers 2 to 6 are arranged. n-type source layers 9, 9', . . . are selectively formed on the surface of the p-type base layer 15 in the direction perpendicular to the direction in which the n- and p-type pillar layers 2 to 6 are arranged.

The present embodiment exerts effects similar to those of the first embodiment. The present embodiment can further form a contact region 18 for the source electrode over a relatively wide area on the surface of the p-type base layer 7 between the n-type source layers 8, 8', . . . and on the surface of the p-type base layer 15 between the n-type source layers 9, 9'. This makes it possible to easily reduce the size of elements.

Fourth Embodiment

Now, a fourth embodiment of the present invention will be described below. Basic items of the fourth embodiment are the same as those of the first embodiment. Accordingly, the items described in the first embodiment will not be described in detail.

FIGS. 13 to 20 are sectional views schematically showing a method for manufacturing a semiconductor device in accordance with the present embodiment.

First, as shown in FIG. 13, an n-type epitaxial layer (n$^-$-type epitaxial layer) 102 with a low impurity concentration is formed on an n-type semiconductor substrate (n$^+$-type semiconductor layer) 101 with a high impurity concentration. The n-type semiconductor substrate 101 constitutes an n-type drain layer in SJ-MOSFET. The n-type epitaxial layer 102 contains phosphorus (P).

Then, as shown in FIG. 14, photolithography and RIE are used to form trenches 103 in the n-type epitaxial layer 102; the trenches 103 reach the n-type semiconductor substrate 101. This forms n-type semiconductor portions 102a each sandwiched between the trenches (first and second trenches) 103 and defined by a side surface (first side surface) of each trench 103. The width of each n-type semiconductor portion 102a is substantially equal to that of each trench 103. This results in a structure in which the plurality of n-type semiconductor portions 102a and the plurality of trenches 103 are alternately formed.

Then, as shown in FIG. 15, a silicon oxide film is formed on the n-type semiconductor portion 102a as a mask film 104.

Figure 16:
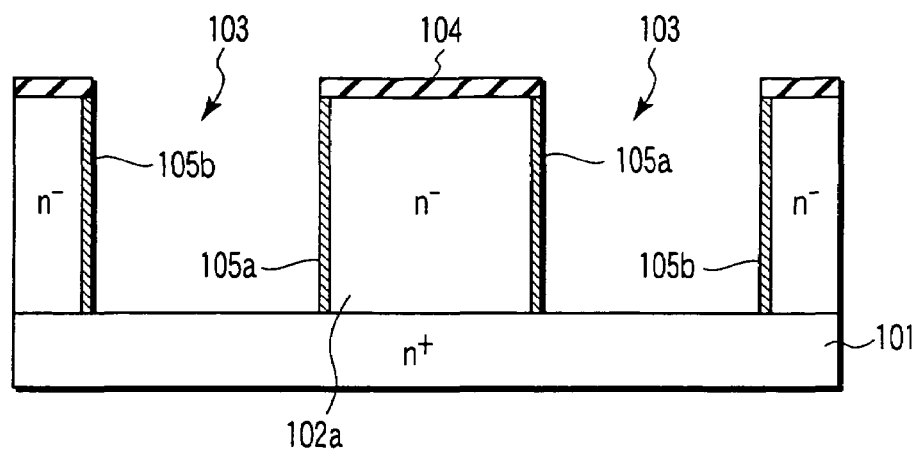

Then, as shown in FIG. 16, the parallel ion implantation process is used to implant arsenic (As: predetermined n-type impurities) and boron (B: predetermined p-type impurities) into side walls of the trenches. As a result, impurity layers containing As and B are formed on the side surfaces of the trenches 103. That is, an impurity layer (first impurity layer) 105a is formed on one side surface (first side surface) of the trench 103. An impurity layer (second impurity layer) 105b is formed on the other side surface (second side surface) of the trench 103.

Figure 17:
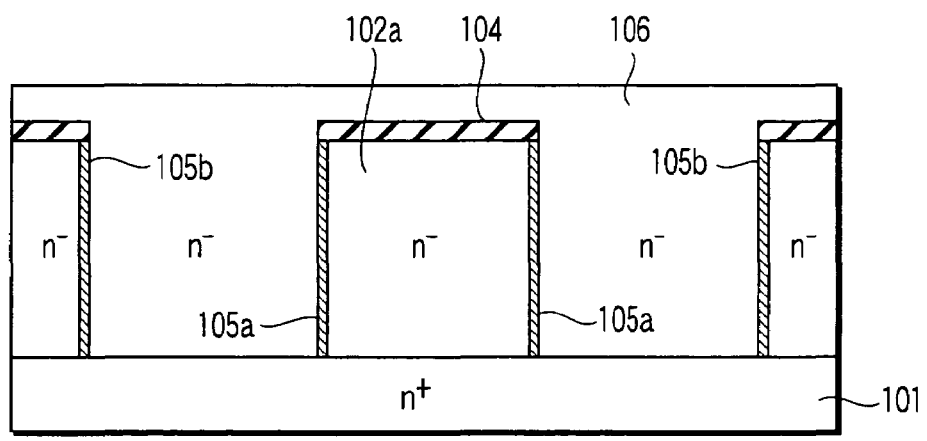

Then, as shown in FIG. 17, an n-type epitaxial layer (n$^-$-type epitaxial layer) 106 is formed so as to fill the trenches 103. The n-type epitaxial layer 106 contains phosphorus as n-type impurities.

Figure 18:
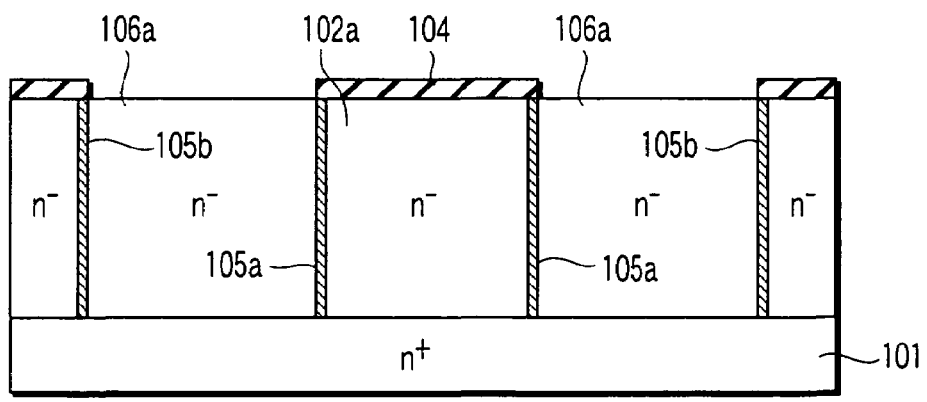

Then, as shown in FIG. 18, the CMP process is used to remove the n-type epitaxial layer 106 located outside the trenches 103. This forms n-type semiconductor portions (first and second additional n-type semiconductor portions) 106a in the trenches (first and second trenches) 103. The width of the n-type semiconductor portion 102a is substantially equal to that of the n-type semiconductor portion 106a.

Figure 19:
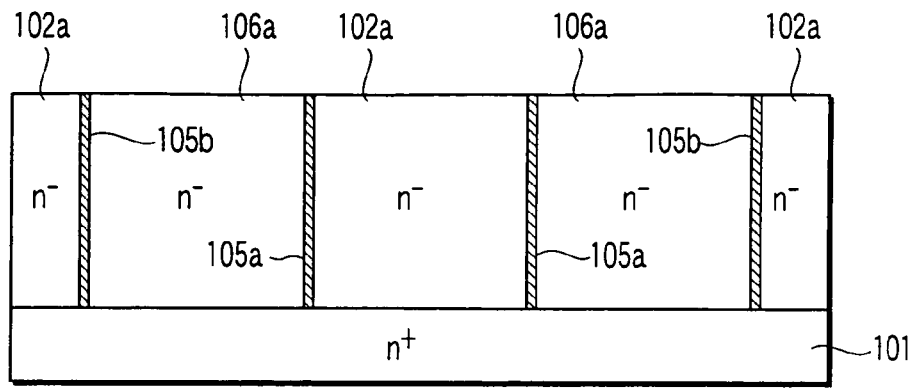

Then, as shown in FIG. 19, an HF-based etchant is used to remove the mask film 104 exposed as a result of the step shown in FIG. 18.

Figure 20:
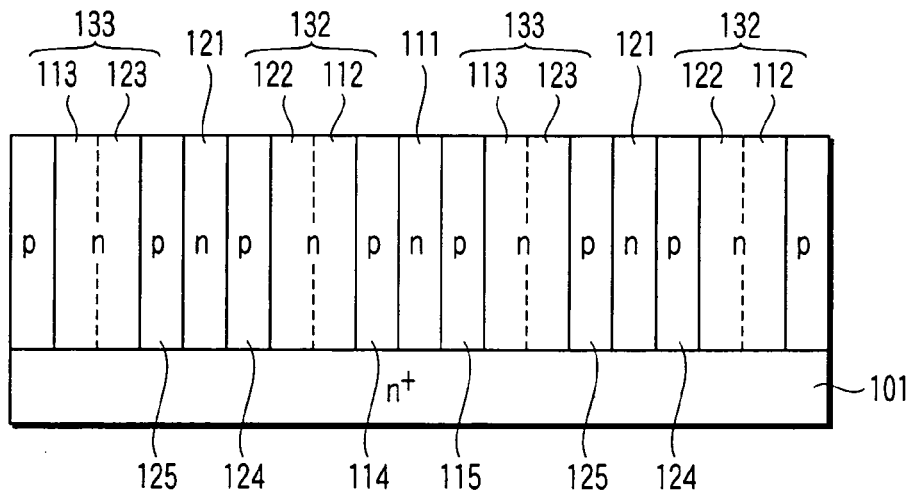

Then, as shown in FIG. 20, a thermal treatment is carried out to simultaneously diffuse As and B supplied to the impurity layers 105a and 105b, into the n-type semiconductor portions 102a and 106a. This forms a plurality of semiconductor pillar layers as shown below.

As and B supplied to the impurity layer 105a are diffused into the n-type semiconductor portion 102a. This results in a pillar structure portion formed of an n-type pillar layer (first n-type pillar layer) 111, an n-type pillar layer (second n-type pillar layer) 112, an n-type pillar layer (third n-type pillar layer) 113, a p-type pillar layer (first p-type pillar layer) 114, and a p-type pillar layer (second p-type pillar layer) 115.

As and B supplied to the impurity layers 105a and 105b are diffused into the n-type semiconductor portions 106a, located on the opposite sides of the n-type semiconductor portion 102a. This results in pillar structure portions (first and second additional pillar structure portions) formed of an n-type pillar layer (first n-type pillar layer) 121, an n-type pillar layer (second n-type pillar layer) 122, an n-type pillar layer (third n-type pillar layer) 123, a p-type pillar layer (first p-type pillar layer) 124, and a p-type pillar layer (second p-type pillar layer) 125.

Since the width of the n-type semiconductor portion 102a is substantially equal to that of the n-type semiconductor portion 106a, the pillar structure portion formed in the n-type semiconductor portion 102a is equivalent to that formed in the n-type semiconductor portion 106a. A structure is obtained in which a plurality of pillar structure portions are repeatedly arranged in one direction. Further, in adjacent pillar structure portions, the n-type pillar layers 112 and 122 are shared and substantially constitute united one n-type pillar layer 132, and the n-type pillar layers 113 and 123 are shared and substantially constitute united one n-type pillar layer 133.

Although not particularly shown, the subsequent steps are similar to those in accordance with the first, second, or third embodiment. That is, a p-type base layer is formed on the surface of the pillar structure portion. Moreover, an n-type source layer is formed on the surface of the p-type base layer. Subsequently, the following steps are executed to obtain SJ-MOSFET: a step of forming a gate insulating film and a gate electrode, a step of forming an interlayer insulating film, a step of forming contact holes in the interlayer insulating film, and a step of forming a source electrode and a drain electrode.

Figure 21:
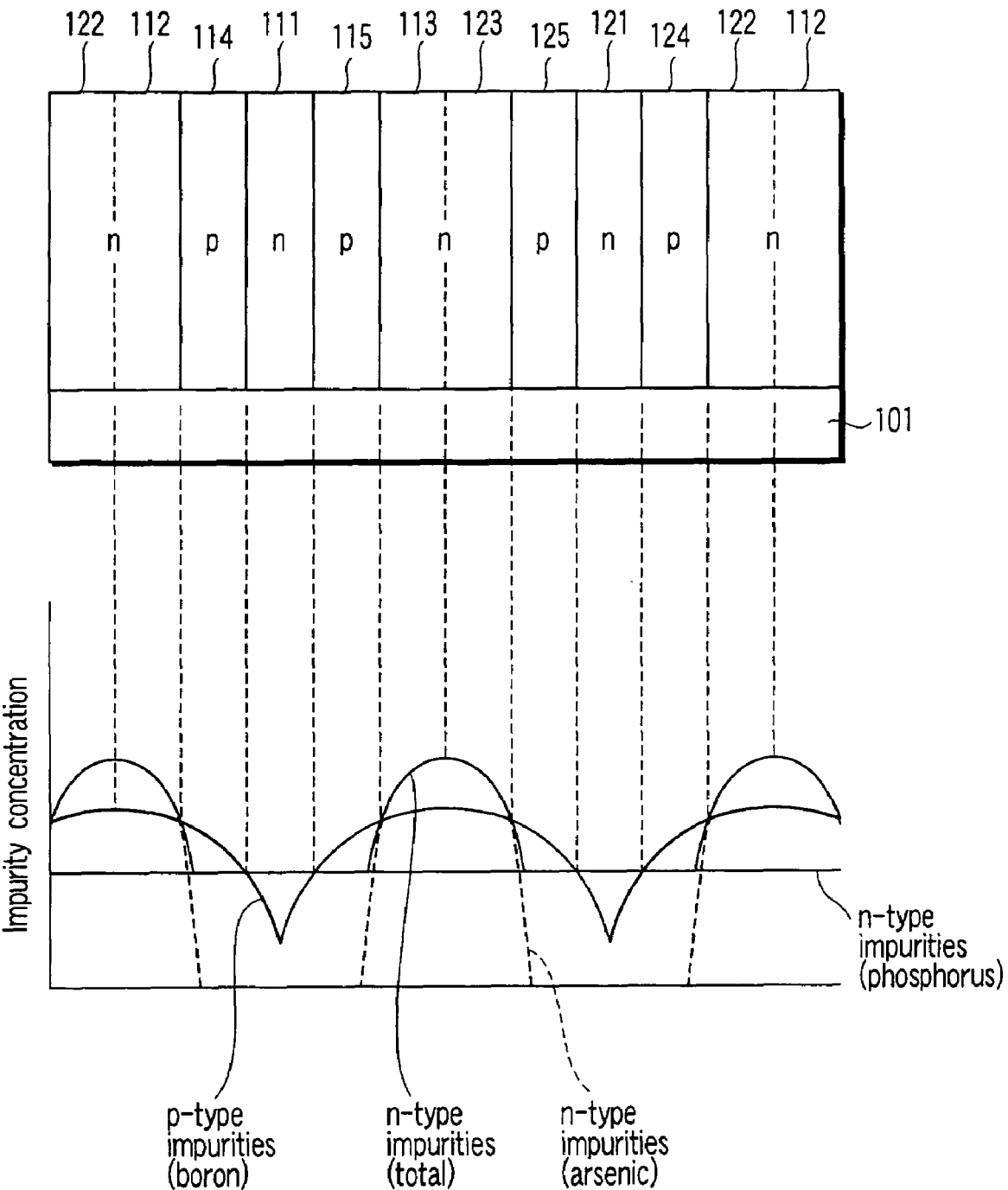
FIG. 21 is a diagram schematically showing an example of a concentration profile of impurities in accordance with the fourth embodiment of the present invention.

FIG. 21 is a diagram schematically showing an example of concentration profiles of n- and p-type impurities in accordance with the present embodiment. Such concentration profiles as shown in FIG. 21 can be obtained by utilizing the difference in diffusion coefficient between the predetermined p-type impurities (boron) and the predetermined n-type impurities (arsenic) and adjusting diffusion conditions (diffusion temperature, diffusion time, and the like).

The basic profiles shown in FIG. 21 are similar to those shown in FIG. 2 for the first embodiment. That is, the concentration profile of each pillar structure portion is similar to that shown in FIG. 2. Therefore, for the details of the concentration profiles, read the first embodiment, and their description is omitted.

As described above, in the present embodiment, five pillar layers can be formed in one pillar structure portion by appropriately setting conditions for the process of forming n- and p-type pillar layers as in the case of the first embodiment. Consequently, as in the first embodiment, the concentration of impurities in the pillar layers can be increased. This makes it possible to form SJ-MOSFET with a reduced on resistance.

Further, in the present embodiment, the n-type semiconductor portions 106a are formed in the trenches 103 formed on the opposite sides of the n-type semiconductor portion 102a. Thus, the n- and p-type impurities (As and B) contained in the impurity layers 105a and 105b can be simultaneously diffused into the n-type semiconductor portions 102a and 106a. This enables pillar layers to be formed in the region where the trenches 103 have been formed. Therefore, a lot of pillar layers can be efficiently formed.

Fifth Embodiment

Figure 22:
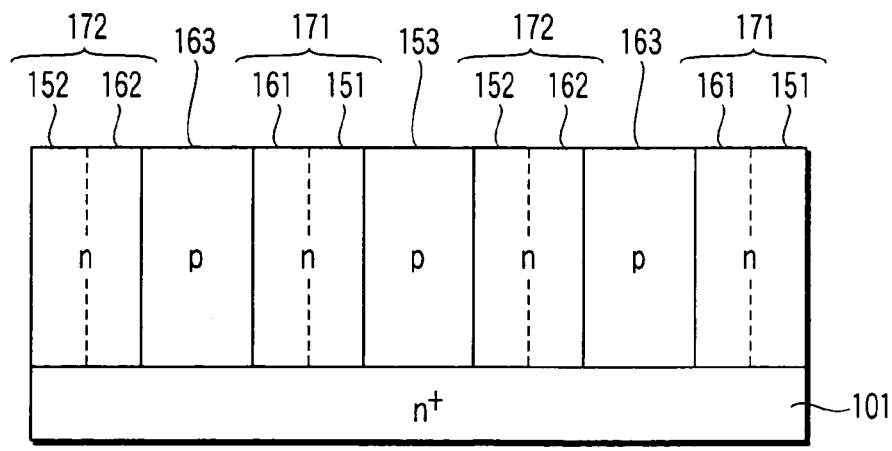
FIG. 22 is a sectional view schematically showing the configuration of a semiconductor device in accordance with a fifth embodiment of the present invention.

FIG. 22 is a sectional view schematically showing the configuration of a semiconductor device in accordance with a fifth embodiment of the present invention. The basic manufacturing method in accordance with the fifth embodiment is similar to that of the fourth embodiment. Accordingly, the items described in the fourth embodiment will not be described in detail.

First, the steps shown in FIGS. 13 to 19 are executed in the same manner as described in the fourth embodiment. Here, epitaxial layers in which n-type impurities are not doped may be used instead of n-type semiconductor portions 102a and 106a respectively, in the present embodiment.

After the step shown in FIG. 19, a thermal treatment is carried out to simultaneously diffuse As and B supplied to the impurity layers 105a and 105b, into the n-type epitaxial layers 102a and 106a. This forms a plurality of semiconductor pillar layers as shown below.

As and B supplied to the impurity layer 105a are diffused into the n-type semiconductor portion 102a, shown in FIG. 19. This results in a pillar structure portion formed of two n-type pillar layers 151 and 152, and a p-type pillar layer 153.

As and B supplied to the impurity layer (first impurity layer) 105a and impurity layer (second impurity layer) 105b are diffused into the n-type semiconductor portions 106a, located on the opposite sides of the n-type semiconductor portion 102a. This results in pillar structure portions (first and second additional pillar structure portions) formed of two n-type pillar layers 161 and 162, and a p-type pillar layer 163.

Since the width of the n-type semiconductor portion 102a is substantially equal to that of the n-type semiconductor portion 106a, the pillar structure portion formed in the n-type semiconductor portion 102a is equivalent to that formed in the n-type semiconductor portion 106a. A structure is thus obtained in which a plurality of pillar structure portions are repeatedly arranged in one direction. Further, in adjacent pillar structure portions, the n-type pillar layers 151 and 161 are shared and substantially constitute united one n-type pillar layer 171, and the n-type pillar layers 152 and 162 are shared and substantially constitute united one n-type pillar layer 172.

Although not particularly shown, the subsequent steps are similar to those in accordance with the first, second, or third embodiment. That is, a p-type base layer is formed on the surface of the pillar structure portion. Moreover, an n-type source layer is formed on the surface of the p-type base layer. Subsequently, the following steps are executed to obtain SJ-MOSFET: a step of forming a gate insulating film and a gate electrode, a step of forming an interlayer insulating film, a step of forming contact holes in the interlayer insulating film, and a step of forming a source electrode and a drain electrode.

Figure 23:
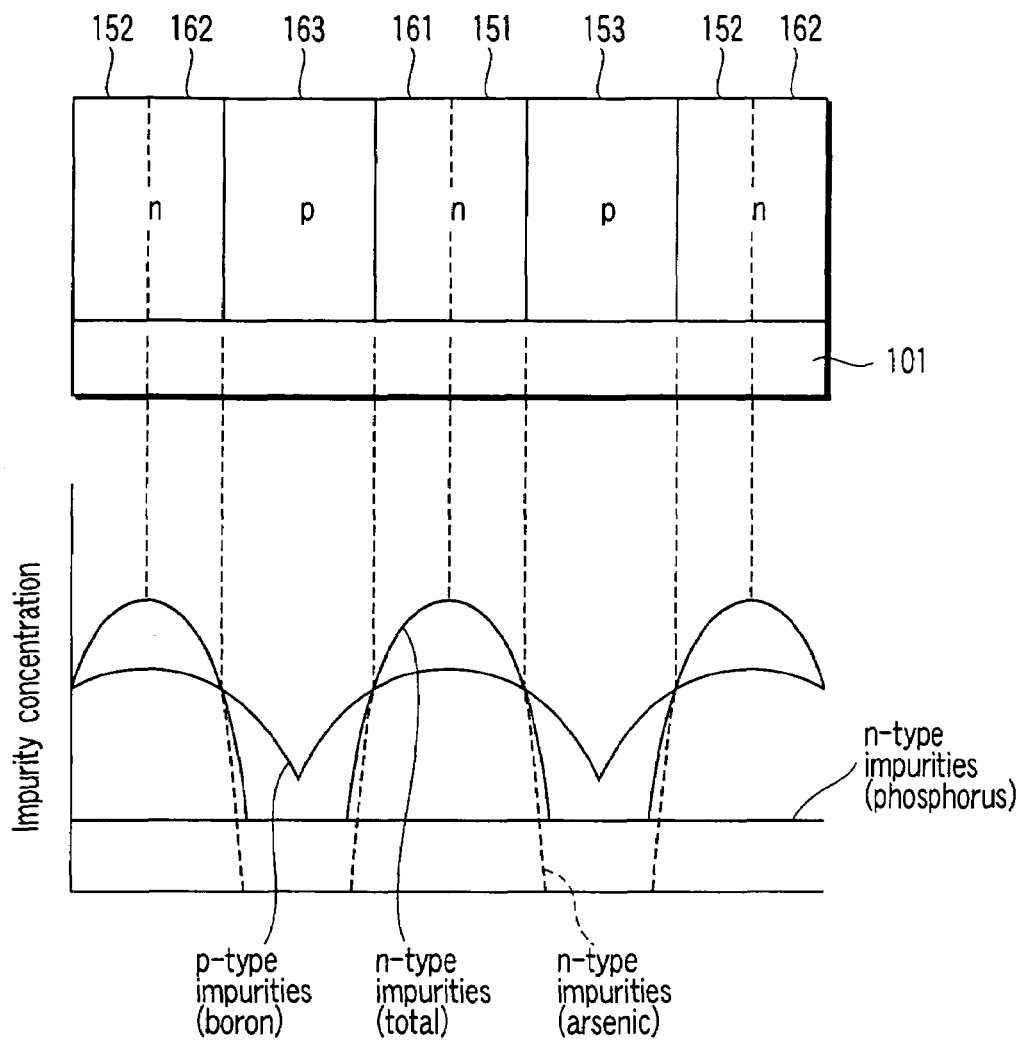
FIG. 23 is a diagram schematically showing an example of a concentration profile of impurities in accordance with the fifth embodiment of the present invention.

FIG. 23 is a diagram schematically showing an example of concentration profiles of n- and p-type impurities in accordance with the present embodiment. Such concentration profiles as shown in FIG. 23 can be obtained by utilizing the difference in diffusion coefficient between the predetermined p-type impurities (boron) and the predetermined n-type impurities (arsenic) and adjusting diffusion conditions (diffusion temperature, diffusion time, and the like).

As shown in FIG. 23, in the n-type pillar layers 151, 152, 161, and 162, the n-type impurity concentration (the total concentration of phosphorus and arsenic) is higher than the p-type impurity concentration (boron concentration). In the p-type pillar layers 153 and 163, the p-type impurity concentration is higher than the n-type impurity concentration.

Further, the n-type impurity concentration decreases gradually from an end to the center of each pillar structure portion. Accordingly, the n-type impurity concentration of each of the n-type pillar layers 151 and 152 is higher than that of the p-type pillar layer 153. Likewise, the n-type impurity concentration of each of the n-type pillar layers 161 and 162 is higher than that of the p-type pillar layer 163. Furthermore, the p-type impurity concentration decreases gradually from an end to the center of the pillar structure portion. Accordingly, the p-type impurity concentration of each of the n-type pillar layers 151 and 152 is higher than that of the p-type pillar layer 153. Likewise, the p-type impurity concentration of each of the n-type pillar layers 161 and 162 is higher than that of the p-type pillar layer 163.

As described above, in the present embodiment, the n-type semiconductor portions 106a are also formed in the trenches 103 formed on the opposite sides of the n-type semiconductor portion 102a as in the case of the fourth embodiment. Thus, the n- and p-type impurities (As and B) contained in the impurity layers 105a and 105b can be simultaneously diffused into the n-type semiconductor portions 102a and 106a. This enables pillar layers to be formed in the region where the trenches 103 have been formed. Therefore, a lot of pillar layers can be efficiently formed.

Sixth Embodiment

In the above fourth and fifth embodiments, the trench 103 and the n-type semiconductor portion 102a have substantially the equal width. That is, the n-type semiconductor portions 102a and 106a have substantially the equal width. In the present embodiment, the trench 103 and the n-type semiconductor portion 102a have different widths, so that the n-type semiconductor portions 102a and 106a have different widths. Basic items of the sixth embodiment are the same as those of the fourth and fifth embodiments, with their detailed description omitted.

Figure 24:
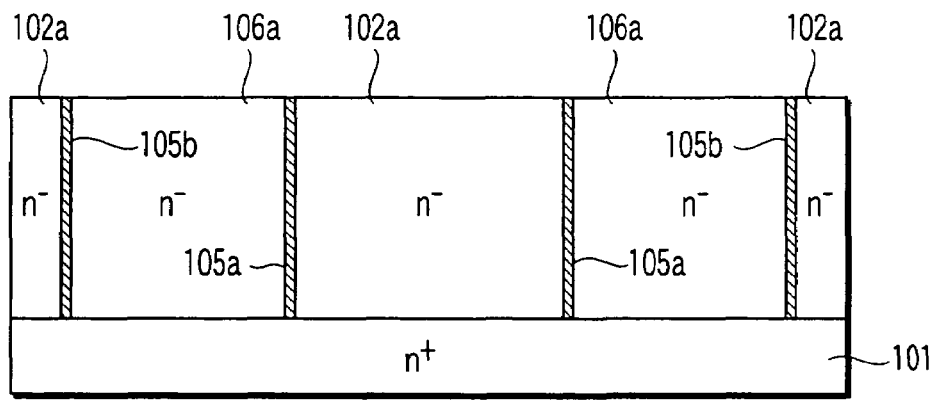
FIG. 24 is a sectional view schematically showing a part of a process of manufacturing a semiconductor device in accordance with an example of a sixth embodiment of the present invention.
Figure 25:
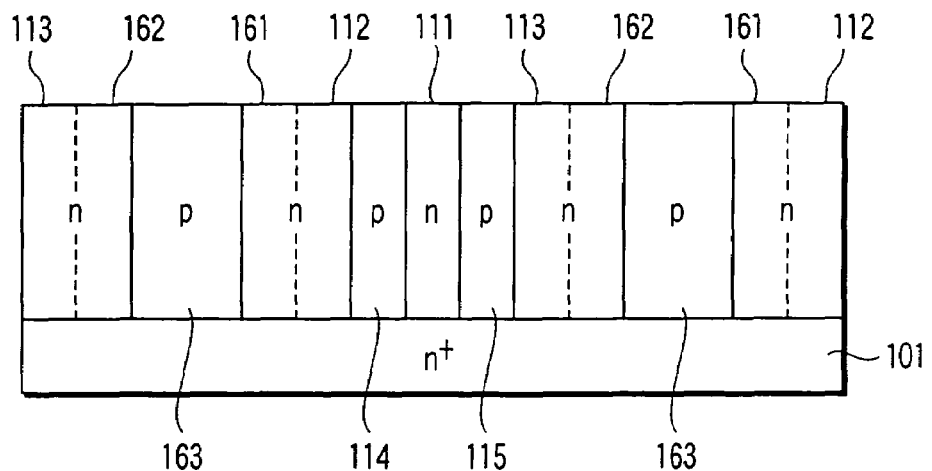
FIG. 25 is a sectional view schematically showing a part of the process of manufacturing a semiconductor device in accordance with the example of the sixth embodiment of the present invention.

FIGS. 24 and 25 are sectional views schematically showing an example of a method for manufacturing a semiconductor device in accordance with the present embodiment. As shown in FIG. 24, in the present example, the n-type semiconductor portion 102a is wider than the n-type semiconductor portion 106a. As a result, in the region where the n-type semiconductor portion 102a has been formed, a pillar structure portion is obtained which is formed of the n-type pillar layers 111, 112, and 113 and the p-type pillar layers 114 and 115 as in the fourth embodiment. Further, in the region where the n-type semiconductor portion 106a has been formed, a pillar structure portion is obtained which is formed of the n-type pillar layers 161 and 162 and the p-type pillar layer 163 as in the fifth embodiment.

Figure 26:
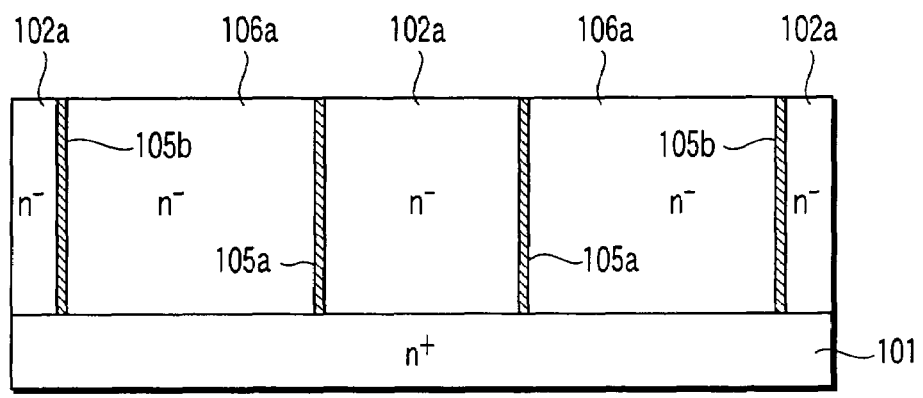
FIG. 26 is a sectional view schematically showing a part of a process of manufacturing a semiconductor device in accordance with another example of the sixth embodiment of the present invention.
Figure 27:
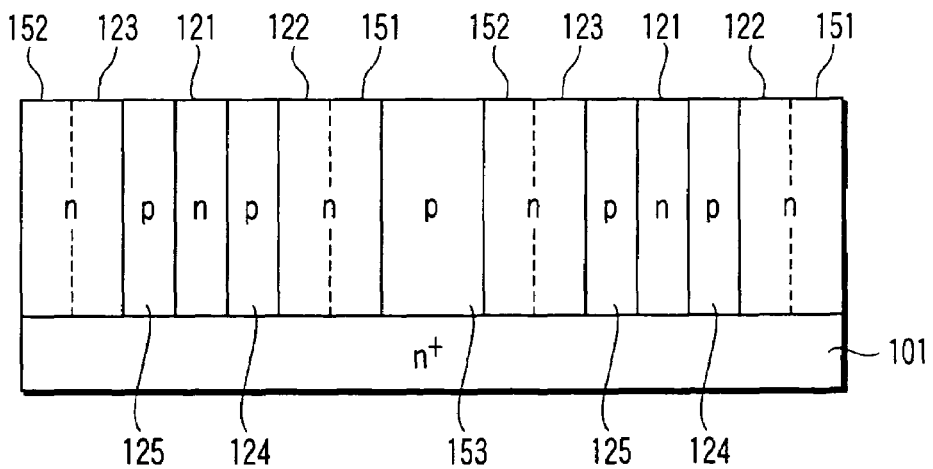
FIG. 27 is a sectional view schematically showing a part of the process of manufacturing a semiconductor device in accordance with another example of the sixth embodiment of the present invention.

FIGS. 26 and 27 are sectional views schematically showing another example of a method for manufacturing a semiconductor device in accordance with the present embodiment. As shown in FIG. 26, in the present example, the n-type semiconductor portion 102a is narrower than the n-type semiconductor portion 106a. As a result, in the region where the n-type semiconductor portion 102a has been formed, a pillar structure portion is obtained which is formed of the n-type pillar layers 151 and 152 and the p-type pillar layer 153 as in the fifth embodiment. Further, in the region where the n-type semiconductor portion 106a has been formed, a pillar structure portion is obtained which is formed of the n-type pillar layers 121, 122, and 123 and the p-type pillar layers 124 and 125 as in the fourth embodiment.

As described above, pillar layers can be formed in the region where the trenches 103 have been formed, as in the case of the fourth and fifth embodiments. Therefore, a lot of pillar layers can be efficiently formed.

The above first to sixth embodiments can be subjected to many changes such as those described below.

In the above first to sixth embodiments, when impurity layers are formed on the side walls of the trenches, the predetermined n- and p-type impurities (arsenic and boron) are ion-implanted. However, impurity layers may be formed on the side walls of the trenches by vapor phase diffusion of the predetermined n- and p-type impurities. Alternatively, impurity layers may be formed on the side walls of the trenches by using atomic layer deposition (ALD) of the predetermined n- and p-type impurities.

In the above first to sixth embodiments, arsenic (As) is used as the predetermined n-type impurities, whereas boron (B) is used as the predetermined p-type impurities. However, other impurities may be used provided that they are a combination of n- and p-type impurities having different diffusion coefficients.

In the above first to sixth embodiments, the first conductivity type is the n type, whereas the second conductivity type is the p type. However, the first conductivity type may be the p type, whereas the second conductivity type may be the n type.

In the above first to sixth embodiments, SJ-MOSFET is illustrated as a semiconductor device. However, the configuration and manufacturing method shown in the first to sixth embodiments are applicable to other semiconductor devices.

Semiconductor devices obtained in accordance with the above first to sixth embodiments are applicable to for example, domestic electric apparatuses (for example, televisions), transportation apparatuses (for example, automobiles), and apparatuses in factories (for example, computer-controlled machine tool (CNC)).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first-conductivity type semiconductor substrate;
a pillar structure portion formed on the first-conductivity type semiconductor substrate and formed of five semiconductor pillar layers arranged in one direction parallel to a main surface of the first-conductivity type semiconductor substrate; and
isolation insulating portions formed on the first-conductivity type semiconductor substrate and sandwiching the pillar structure portion between the isolation insulating portions,
wherein the pillar structure portion is formed of a first first-conductivity type pillar layer, a second first-conductivity type pillar layer and a third first-conductivity type pillar layer which sandwich the first first-conductivity type pillar layer, a first second-conductivity type pillar layer provided between the first first-conductivity type pillar layer and the second first-conductivity type pillar layer, and a second second-conductivity type pillar layer provided between the first first-conductivity type pillar layer and the third first-conductivity type pillar layer,
wherein the second first-conductivity type pillar layer has a first-conductivity type impurity concentration higher than that of the first first-conductivity type pillar layer and that of the first second-conductivity type pillar layer, and the third first-conductivity type pillar layer has a first-conductivity type impurity concentration higher than that of the first-conductivity type pillar layer and that of the second second-conductivity type pillar layer,
the second first-conductivity type pillar layer has a second-conductivity type impurity concentration higher than that of the first first-conductivity type pillar layer and that of the first second-conductivity type pillar layer, and the third first-conductivity type pillar layer has a second-conductivity type impurity concentration higher than that of the first-conductivity type pillar layer and that of the second-second-conductivity type pillar layer, and
each of the first second-conductivity type pillar layer and the second-conductivity type pillar layer has a second-conductivity type impurity concentration higher than that of the first first-conductivity type pillar layer.

2. The semiconductor device according to claim 1, wherein let M1 be a total net amount of first-conductivity type impurities in the first, second, and third first-conductivity type pillar layers, let M2 be a total net amount of second-conductivity type impurities in the first and second second-conductivity type pillar layers, and M1 and M2 meet the following formula:

$$-15 \leq 100(M2-M1)/M1 \leq 15.$$

3. The semiconductor device according to claim 1, wherein the first-conductivity type semiconductor substrate functions as a first-conductivity type drain layer, and the semiconductor device further comprises:

a second-conductivity type base layer formed on a surface of the pillar structure portion;

a first-conductivity type source layer formed on a surface of the second-conductivity type base layer;

a gate insulating film formed on that part of the second-conductivity type base layer which is positioned between the second first-conductivity type pillar layer and the first-conductivity type source layer; and a gate electrode formed on the gate insulating film.

4. The semiconductor device according to claim 1, further comprising a second-conductivity type base layer formed on a surface of the pillar structure portion, the second-conductivity type base layer crossing a boundary between the first first-conductivity type pillar layer and the first second-conductivity type pillar layer, a boundary between the first first-conductivity type pillar layer and the second-conductivity type pillar layer, a boundary between the second first-conductivity type pillar layer and the first second-conductivity type pillar layer, and a boundary between the third first-conductivity type pillar layer and the second second-conductivity type pillar layer.

5. The semiconductor device according to claim 4, wherein the first-conductivity type semiconductor substrate functions as a first-conductivity type drain layer, and the semiconductor device further comprises:

a first-conductivity type source layer formed on a surface of the second-conductivity type base layer;

a gate insulating film formed on that part of the second-conductivity type base layer which is positioned between the second first-conductivity type pillar layer and the first-conductivity type source layer; and a gate electrode formed on the gate insulating film.

6. The semiconductor device according to claim 1, further comprising:

a first second-conductivity type base layer formed on a surface of the pillar structure portion, the first second-conductivity type base layer crossing a boundary between the first first-conductivity type pillar layer and the first second-conductivity type pillar layer, and a boundary between the second first-conductivity type pillar layer and the first second-conductivity type pillar layer; and a second second-conductivity type base layer formed on the surface of the pillar structure portion, the second second-conductivity type base layer crossing a boundary between the first first-conductivity type pillar layer and the second second-conductivity type pillar layer, and a boundary between the third first-conductivity type pillar layer and the second second-conductivity type pillar layer.

7. The semiconductor device according to claim 6, wherein the first-conductivity type semiconductor substrate functions as a first-conductivity type drain layer, and the semiconductor device further comprises:

a first first-conductivity type source layer formed on a surface of the first second-conductivity type base layer;

a first gate insulating film formed on that part of the first second-conductivity type base layer which is positioned between the second first-conductivity type pillar layer and the first first-conductivity type source layer;

a first gate electrode formed on the first gate insulating film;

a second first-conductivity type source layer formed on a surface of the second second-conductivity type base layer;

a second gate insulating film formed on that part of the second second-conductivity type base layer which is positioned between the third first-conductivity type pillar layer and the second first-conductivity type source layer;

a second gate electrode formed on the second gate insulating film.

8. The semiconductor device according to claim 1, wherein the second and third first-conductivity type pillar layers and the first and second second-conductivity type pillar layers contain predetermined first-conductivity type impurities, and the first, second, and third first-conductivity type pillar layers and the first and second second-conductivity type pillar layers contain predetermined second-conductivity type impurities having a diffusion coefficient larger than that of the predetermined first-conductivity type impurities.

9. The semiconductor device according to claim 8, wherein the predetermined first-conductivity type impurities are arsenic (As) and the predetermined second-conductivity type impurities are boron (B).

10. A semiconductor device comprising:

a first-conductivity type semiconductor substrate; and a pillar structure portion formed on the first-conductivity type semiconductor substrate and formed of a first first-conductivity type pillar layer, a second first-conductivity type pillar layer and a third first-conductivity type pillar layer which sandwich the first-conductivity type pillar layer, a first second-conductivity type pillar layer provided between the first first-conductivity type pillar layer and the second first-conductivity type pillar layer, and a second second-conductivity type pillar layer provided between the first-conductivity type pillar layer and the third first-conductivity type pillar layer, which are arranged in one direction parallel to a main surface of the first-conductivity type semiconductor substrate, wherein the second first-conductivity type pillar layer has a first-conductivity type impurity concentration higher than that of the first first-conductivity type pillar layer and that of the first second-conductivity type pillar layer, and the third first-conductivity type pillar layer has a first-conductivity type impurity concentration higher than that of the first-conductivity type pillar layer and that of the second second-conductivity type pillar layer, the second first-conductivity type pillar layer has a second-conductivity type impurity concentration higher than that of the first first-conductivity type pillar layer and that of the first second-conductivity type pillar layer, and the third first-conductivity type pillar layer has a second-conductivity type impurity concentration higher than that of the first first-conductivity type pillar layer and that of the second-second-conductivity type pillar layer, and each of the first second-conductivity type pillar layer and the second-conductivity type pillar layer has a second-conductivity type impurity concentration higher than that of the first first-conductivity type pillar layer.

11. The semiconductor device according to claim 10, further comprising isolation insulating portions formed on the first-conductivity type semiconductor substrate and sandwiching the pillar structure portion between the isolation insulating portions.

12. The semiconductor device according to claim 10, wherein a plurality of the pillar structure portions are repeatedly arranged in the one direction, and adjacent ones of the pillar structure portions share one of the second first-conductivity type pillar layer and the third first-conductivity type pillar layer.

13. The semiconductor device according to claim 10, wherein the second and third first-conductivity type pillar layers and the first and second second-conductivity type pillar layers contain predetermined first-conductivity type impurities, and the first, second, and third first-conductivity type pillar layers and the first and second second-conductivity type pillar layers contain predetermined second-conductivity type impurities having a diffusion coefficient larger than that of the predetermined first-conductivity type impurities.

14. The semiconductor device according to claim 13, wherein the predetermined first-conductivity type impurities are arsenic (As) and the predetermined second-conductivity type impurities are boron (B).

15. The semiconductor device according to claim 10, wherein let M1 be a total net amount of first-conductivity type impurities in the first, second, and third first-conductivity type pillar layers, let M2 be a total net amount of second-conductivity type impurities in the first and second second-conductivity type pillar layers, and M1 and M2 meet the following formula:

$-15 \leq 100(M2-M1)/M1 \leq 15$.

16. The semiconductor device according to claim 10, wherein the first conductivity type semiconductor substrate functions as a first-conductivity type drain layer, and the semiconductor device further comprises:

a second-conductivity type base layer formed on a surface of the pillar structure Portion;

a first-conductivity type source layer formed on a surface of the second-conductivity type base layer;

a gate insulating film formed on that part of the second-conductivity type base layer which is positioned between the second first-conductivity type pillar layer and the first-conductivity type source layer; and a gate electrode formed on the gate insulating film.

17. The semiconductor device according to claim 10, further comprising a second-conductivity type base layer formed on a surface of the pillar structure portion, the second-conductivity type base layer crossing a boundary between the first first-conductivity type pillar layer and the first second-conductivity type pillar layer, a boundary between the first first-conductivity type pillar layer and the second second-conductivity type pillar layer, a boundary between the second first-conductivity type pillar layer and the first second-conductivity type pillar layer, and a boundary between the third first-conductivity type pillar layer and the second second-conductivity type pillar layer.

18. The semiconductor device according to claim 17, wherein the first-conductivity type semiconductor substrate functions as a first-conductivity type drain layer, and the semiconductor device further comprises:

a first-conductivity type source layer formed on a surface of the second-conductivity type base layer;

a gate insulating film formed on that part of the second-conductivity type base layer which is positioned between the second first-conductivity type pillar layer and the first-conductivity type source layer; and a gate electrode formed on the gate insulating film.

19. The semiconductor device according to claim 10, further comprising:

a first second-conductivity type base layer formed on a surface of the pillar structure portion, the first second-conductivity type base layer crossing a boundary between the first first-conductivity type pillar layer and the first second-conductivity type pillar layer, and a boundary between the second first-conductivity type pillar layer and the first second-conductivity type pillar layer; and a second second-conductivity type base layer formed on the surface of the pillar structure portion, the second second-conductivity type base layer crossing a boundary between the first first-conductivity type pillar layer and the second second-conductivity type pillar layer, and a boundary between the third first-conductivity type pillar layer and the second second-conductivity type pillar layer.

20. The semiconductor device according to claim 19, wherein the first-conductivity type semiconductor substrate functions as a first-conductivity type drain layer, and the semiconductor device further comprises:

a first first-conductivity type source layer formed on a surface of the first second-conductivity type base layer;

a first gate insulating film formed on that part of the first second-conductivity type base layer which is positioned between the second first-conductivity type pillar layer and the first first-conductivity type source layer;

a first gate electrode formed on the first gate insulating film;

a second first-conductivity type source layer formed on a surface of the second second-conductivity type base layer;

a second gate insulating film formed on that part of the second second-conductivity type base layer which is positioned between the third first-conductivity type pillar layer and the second first-conductivity type source layer;

a second gate electrode formed on the second gate insulating film.

* * * * *